(12) United States Patent
Chien et al.

(10) Patent No.: US 10,998,069 B2
(45) Date of Patent: May 4, 2021

(54) SHIFT REGISTER AND ELECTRONIC DEVICE HAVING THE SAME

(71) Applicant: AU Optronics Corporation, Hsin-Chu (TW)

(72) Inventors: Ling-Ying Chien, Hsin-Chu (TW); Kuang-Hsiang Liu, Hsin-Chu (TW); Chee-Wai Lau, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/790,811

(22) Filed: Feb. 14, 2020

(65) Prior Publication Data

US 2020/0286573 A1 Sep. 10, 2020

(30) Foreign Application Priority Data

Mar. 7, 2019 (TW) .................................. 108107669
Nov. 22, 2019 (TW) .................................. 108142636

(51) Int. Cl.
*G11C 19/28* (2006.01)
*G09G 3/3225* (2016.01)

(52) U.S. Cl.
CPC .......... *G11C 19/287* (2013.01); *G09G 3/3225* (2013.01); *G09G 2310/0286* (2013.01); *G09G 2310/08* (2013.01)

(58) Field of Classification Search
CPC ................ G11C 19/287; G09G 3/3225; G09G 2310/0286; G09G 2310/08
See application file for complete search history.

(56) References Cited

U.S. PATENT DOCUMENTS

| 8,040,302 | B2 | 10/2011 | Shin |
| 8,330,685 | B2 | 12/2012 | Park et al. |
| 8,392,775 | B2 | 3/2013 | Liu |
| 9,236,008 | B2 | 1/2016 | Liu |
| 2006/0103323 | A1 | 5/2006 | Eom et al. |
| 2007/0262929 | A1 | 11/2007 | Kim et al. |
| 2014/0140468 | A1 | 5/2014 | Cheng et al. |
| 2016/0042686 | A1* | 2/2016 | Feng .................... G09G 3/3233 345/691 |
| 2017/0237037 | A1* | 8/2017 | Choi ................... H01L 51/5253 257/40 |
| 2019/0378461 | A1 | 12/2019 | Liu |
| 2019/0385687 | A1 | 12/2019 | Li |

FOREIGN PATENT DOCUMENTS

TW       I616866 B       3/2018
WO   WO 2019071758 A1   4/2019

* cited by examiner

*Primary Examiner* — Kenneth B Lee, Jr.
(74) *Attorney, Agent, or Firm* — WPAT, PC

(57) ABSTRACT

An electronic device includes an active area and multiple shift registers. The active area comprises multiple pixel circuits. Each of the multiple shift registers is configured to output a first control signal, a second control signal, and a third control signal to a part of pixel circuits of the multiple pixel circuits. A duty ratio of the third control signal is greater than a duty ratio of the second control signal, and the duty ratio of the second control signal is greater than a duty ratio of the first control signal. A part of the multiple shift registers and other part of the multiple shift registers are substantially symmetrically disposed at two sides of the active area, respectively.

24 Claims, 13 Drawing Sheets

SHIFT REGISTER AND ELECTRONIC DEVICE HAVING THE SAME

CROSS-REFERENCE TO RELATED APPLICATION

This application claims priority to Taiwan Application Serial Number 108107669, filed Mar. 7, 2019, and Taiwan Application Serial Number 108142636, filed Nov. 22, 2019, the entirety of which is incorporated by reference herein in their entireties.

BACKGROUND

Field of Invention

The present disclosure generally relates to an electronic device. More particularly, the present disclosure relates to a shift register of the electronic device capable of generating different signals maintained at different voltages, respectively.

Description of Related Art

Organic light-emitting diode (OLED) displays and micro-LED displays on the market usually use two types of control signals to control pixel circuits. One type of the control signals is maintained at a disabling voltage level for a long time, and is used to update and reset internal node voltage(s) of the pixel circuits. Another type of control signals is maintained at an enabling voltage level for a long time, and is used to determine whether to light up the pixel circuits. Since these two types of control signals are maintained at different voltage levels, the current practice in the industry is to use two types of shift registers to generate these two types of control signals, respectively. The two types of shift registers are usually located at two opposite sides of a display, respectively. For the displays of some electronic devices, however, a through hole or an opening is located in an active area where the pixel circuits are arranged. The through hole or the opening increases the difficulty of routing the signal lines from one side of the active area to the other side. In this case, the current use of different shift registers to generate different control signals has deleterious effect on improving product yield and production speed.

SUMMARY

The disclosure provides an electronic device including an active area and multiple shift registers. The active area comprises multiple pixel circuits. Each of the multiple shift registers is configured to output a first control signal, a second control signal, and a third control signal to a part of pixel circuits of the multiple pixel circuits. A duty ratio of the third control signal is greater than a duty ratio of the second control signal, and the duty ratio of the second control signal is greater than a duty ratio of the first control signal. A part of the multiple shift registers and other part of the multiple shift registers are substantially symmetrically disposed at two sides of the active area, respectively.

The disclosure further provides a shift register including a first output circuit comprising a first node, a second output circuit, an input circuit, and a voltage-stabilizing control circuit. When an enabling voltage is provided to the first node, the first output circuit outputs a corresponding one of a first clock signal group as a second control signal, and outputs a corresponding one of a second clock signal group as a first control signal. A duty ratio of the first clock signal group is different from a duty ratio of the second clock signal group. When the enabling voltage is provided to the first node, the second output circuit outputs a first reference voltage as a third control signal. When a disabling voltage is provided to the first node, the second output circuit outputs a second reference voltage as the third control signal. The input circuit is configured to provide the enabling voltage to the first node. The voltage-stabilizing control circuit is configured to provide the disabling voltage to the first node according to other corresponding one of the first clock signal group.

It is to be understood that both the foregoing general description and the following detailed description are by examples, and are intended to provide further explanation of the disclosure as claimed.

DETAILED DESCRIPTION

Figure 1:
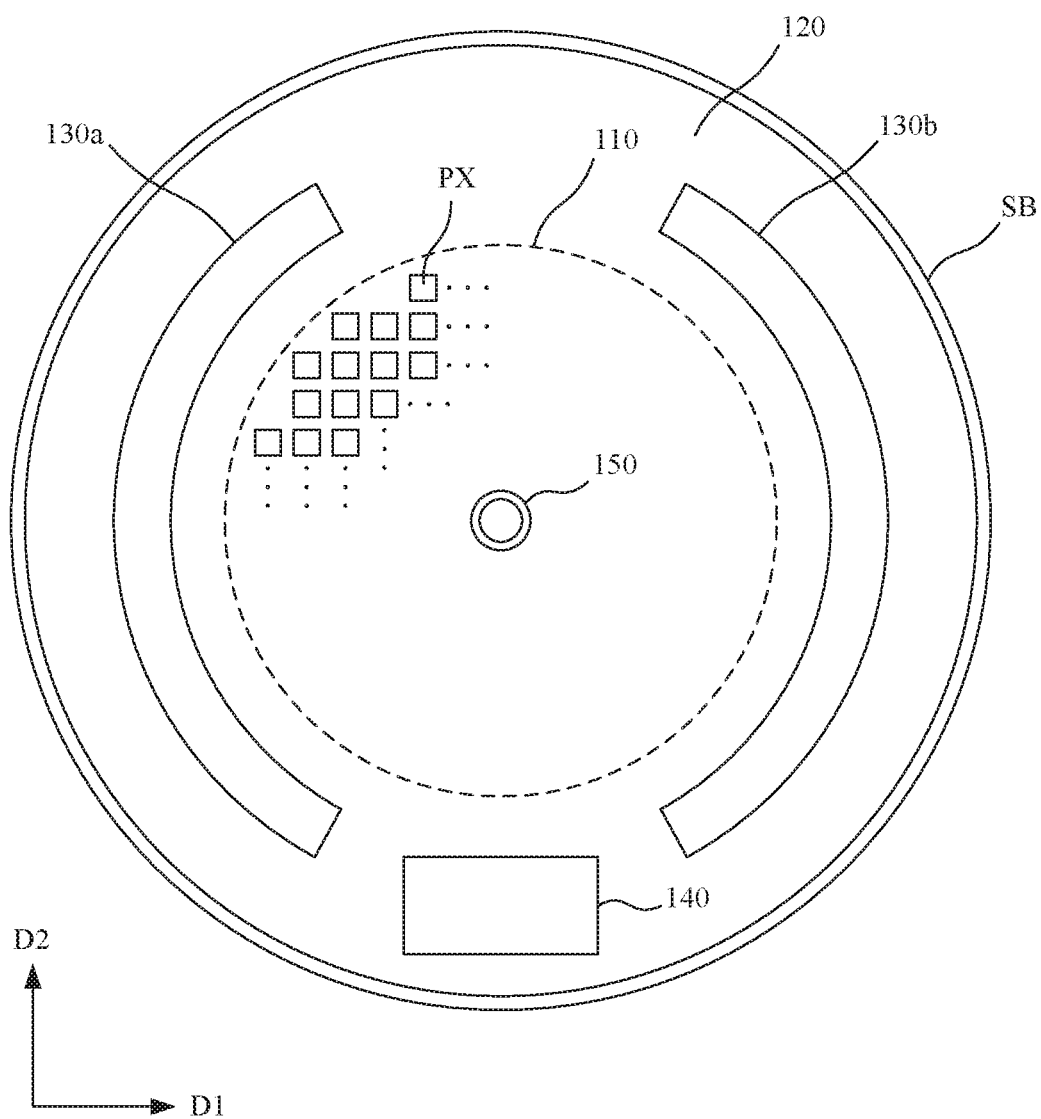
FIG. 1 is a simplified schematic diagram of an electronic device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified schematic diagram of an electronic device 100 according to one embodiment of the present disclosure. The electronic device 100 comprises a substrate SB, a non-rectangular active area 110, and a peripheral area 120 surrounding the active area 110. The active area 110 comprises a plurality of pixel circuits PX, the plurality of pixel circuits PX are arranged, along a first direction D1 and a second direction D2, as a non-rectangular shape in the active area 110. The first direction D1 and the second direction D2 are substantially perpendicular to each other. The electronic device 100 further comprises a through hole 150 disposed in the active area 110, and the plurality of pixel circuits PX arranged as surrounding the through hole 150. The electronic device 100 further comprises a first gate driver 130a, a second gate driver 130b, and a control circuit 140. The first gate driver 130a and the second gate driver 130b have arc shapes extending along the area(s) of the active area 110, and are configured to sequentially update a plurality of rows of the pixels circuits PX, arranged along the first direction D1, in the second direction D2. The control circuit 140 is configured to provide various signals, required for displaying and updating images, to the pixel circuits PX, the first gate driver 130a, and the second gate driver 130b according to externally inputted image data. For the sake of brevity, other functional blocks of the electronic device 100 are not shown in FIG. 1.

The first gate driver 130a and second gate driver 130b are disposed at the left and right sides of the active area 110, respectively, and are configured to drive the pixel circuits PX of the left half and the right half of the active area 110, respectively. Therefore, signals in the active area 110 need not to be wired as surrounding the through hole 150 so as to reach other side of the through hole 150, so that the circuitry complexity of the active area 110 is simplified. The control circuit 140, the first gate driver 130a, and the second gate driver 130b are disposed in the peripheral area 120, but this embodiment is not limited thereto. In some embodiments, the control circuit 140 may be disposed at other substrate different from the substrate SB. Although the active area 110 is depicted as the round shape in FIG. 1, in other embodiments, the active area 110 may be designed as other shapes according to practical requirements, such as the ellipse shape, the polygon shape, or the shape at least one part including a curved edge. Similarly, the peripheral area 120 may be designed as other shapes according to practical requirements.

In some embodiments, the shaped in which the pixel circuits PX are arranged needs not to be corresponding to the shape of the active area 110.

For example, in an embodiment that the pixel circuits PX are realized by liquid pixel circuits, the shape of the active area 110 may be defined by the shape of an opening of a black matrix layer (not shown in FIG. 1) disposed upon a thin-film transistor layer. The pixel circuits PX may be arranged as a rectangular array, and the opening of the black matrix layer may have a non-rectangular shape, so as to form the non-rectangular active area 110.

As another example, in an embodiment that the pixel circuits PX are realized by the OLED pixel circuits, the shape of the active area 110 may be defined by the light transmissive area of a cover lens (not shown in FIG. 1). The pixel circuits PX may be arranged as a rectangular array, and the light transmissive area of the cover lens may be non-rectangular so as to form the non-rectangular active area 110.

In practice, the electronic device 100 may be realized by a digital watch or an electronic clock. The substrate SB may be the dial of the watch or clock, and the through hole 150 may be configured to let the axle, used for moving the hands, to pass through the substrate SB. In the electronic device 100 of some embodiments, the through hole 150 may be omitted, and the electronic device 100 displays time information by using the active area 110.

Figure 2:
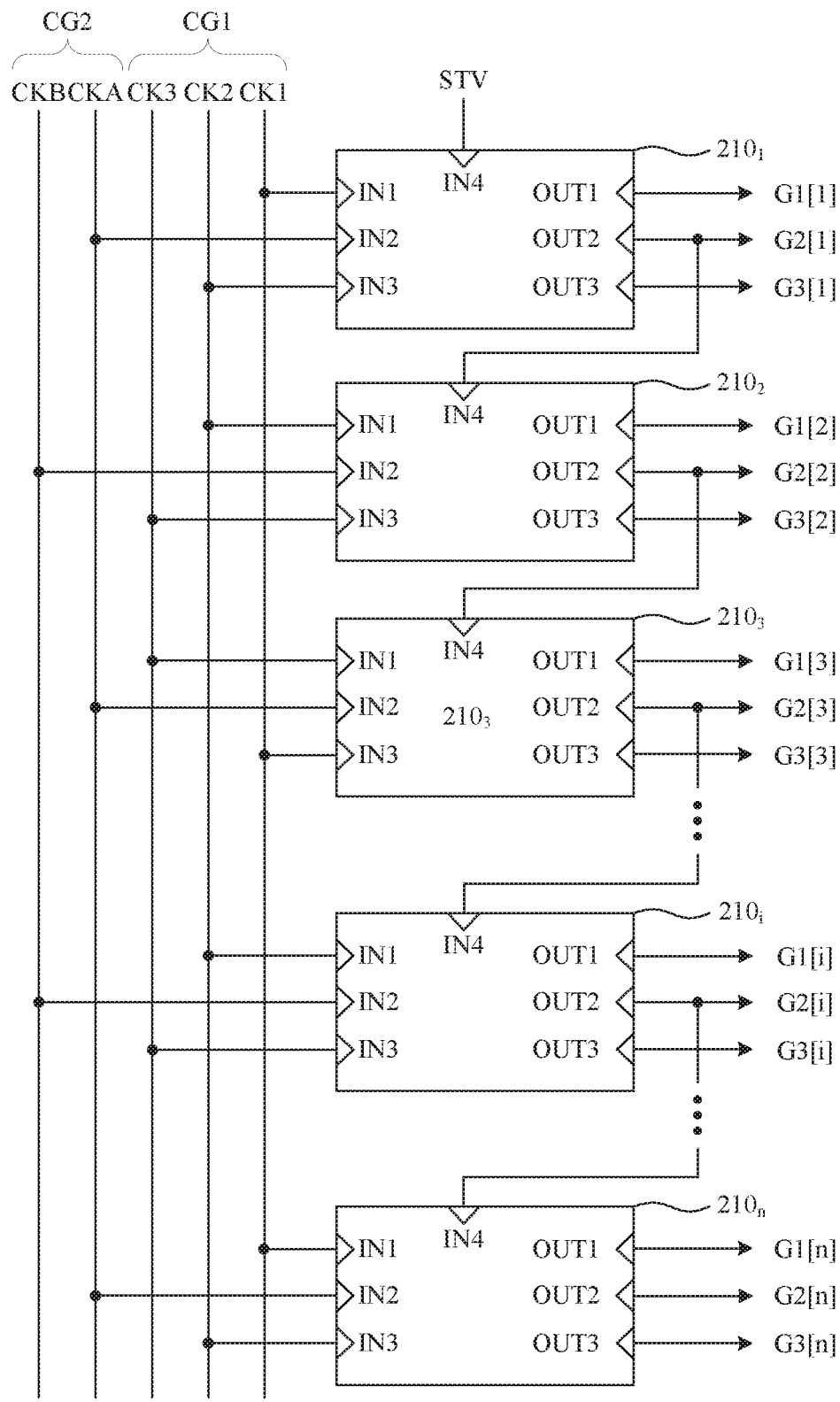
FIG. 2 is a simplified functional block diagram of a gate driver according to one embodiment of the present disclosure.

FIG. 2 is a simplified functional block diagram of a gate driver 200 according to one embodiment of the present disclosure. The first gate driver 130a and the second gate driver 130b of FIG. 1 may be respectively realized by the gate driver 200. The gate driver 200 comprises a plurality of shift registers $210_1$-$210_n$, and is configured to output first control signals G1[1]-G1[$n$], second control signals G2[1]-G2[$n$], and third control signals G3[1]-G3[$n$], and these signals may be used to control the pixel circuits PX of FIG. 1. Each of the shift registers $210_1$-$210_n$ comprises a first input node IN1, a second input node IN2, a third input node IN3, a fourth input node IN4, a first output node OUT1, a second output node OUT2, and a third output node OUT3. For the purpose of illustration convenience, the arrangement of the shift registers $210_1$-$210_n$ in FIG. 2 is simplified from an arc shape to a straight line.

Take the shift register $210_i$ (i.e., the i-th stage shift register) as an example, the first output node OUT1, the second output node OUT2, and the third output node OUT3 of the shift register $210_1$ are configured to output the first control signal G1[$i$], the second control signal G2[$i$], and the third control signal G3[$i$], respectively, wherein i and n are positive integers and i is smaller than or equal to n. The first input node IN1 of the shift register $210_i$ is configured to receive a corresponding one of the first clock signal group CG1. The second input node IN2 of the shift register $210_1$ is configured to receive a corresponding one of the second clock signal group CG2. The third input node IN3 of the shift register $210_1$ is configured to receive other corresponding one of the first clock signal group CG1. The fourth input node IN4 of the shift register $210_1$ is configured to receive the second control signal G2[$i$−1] of the shift register $210_{i-1}$.

In some embodiments, the fourth input node IN4 of the shift register $210_i$ is configured to receive the first control signal G1[$i$−1] of the shift register $210_{i-1}$.

In addition, if i is set to 1, the fourth input node IN4 of the shift register $210_i$ is configured to receive the vertical start signal STV.

In some embodiments, the first clock signal group CG1, the second clock signal group CG2, and the vertical start signal STV are provided by the control circuit 140 of FIG. 1, but this disclosure is not limited thereto. At least one of these signals may be provided by an external circuit different from the control circuit 140.

In this embodiment, the first clock signal group CG1 comprises a clock signal CK1, a clock signal CK2, and a clock signal CK3. The second clock signal group CG2 comprises a clock signal CKA and a clock signal CKB. When i is set to a multiple of 3, the first input node IN1 is configured to receive the clock signal CK3, and the third input node IN3 is configured to receive the clock signal CK1. When i is set to (3×+2), the first input node IN1 is configured to receive the clock signal CK2, and the third input node IN3 is configured to receive the clock signal CK3, wherein x is an integer larger than or equal to 0. When I is set to (3×+1), the first input node IN1 is configured to receive the clock signal CK1, and the third input node IN3 is configured to receive the clock signal CK2.

In addition, when i is an odd number, the second input node IN2 is configured to receive the clock signal CKA. When i is an even number, the second input node IN2 is configured to receive the clock signal CKB.

In this embodiment, each of the first clock signal group CG1 has a first duty ratio, and each of the second clock signal group CG2 has a second duty ratio, wherein the first duty ratio is larger than the second duty ratio.

Figure 3:
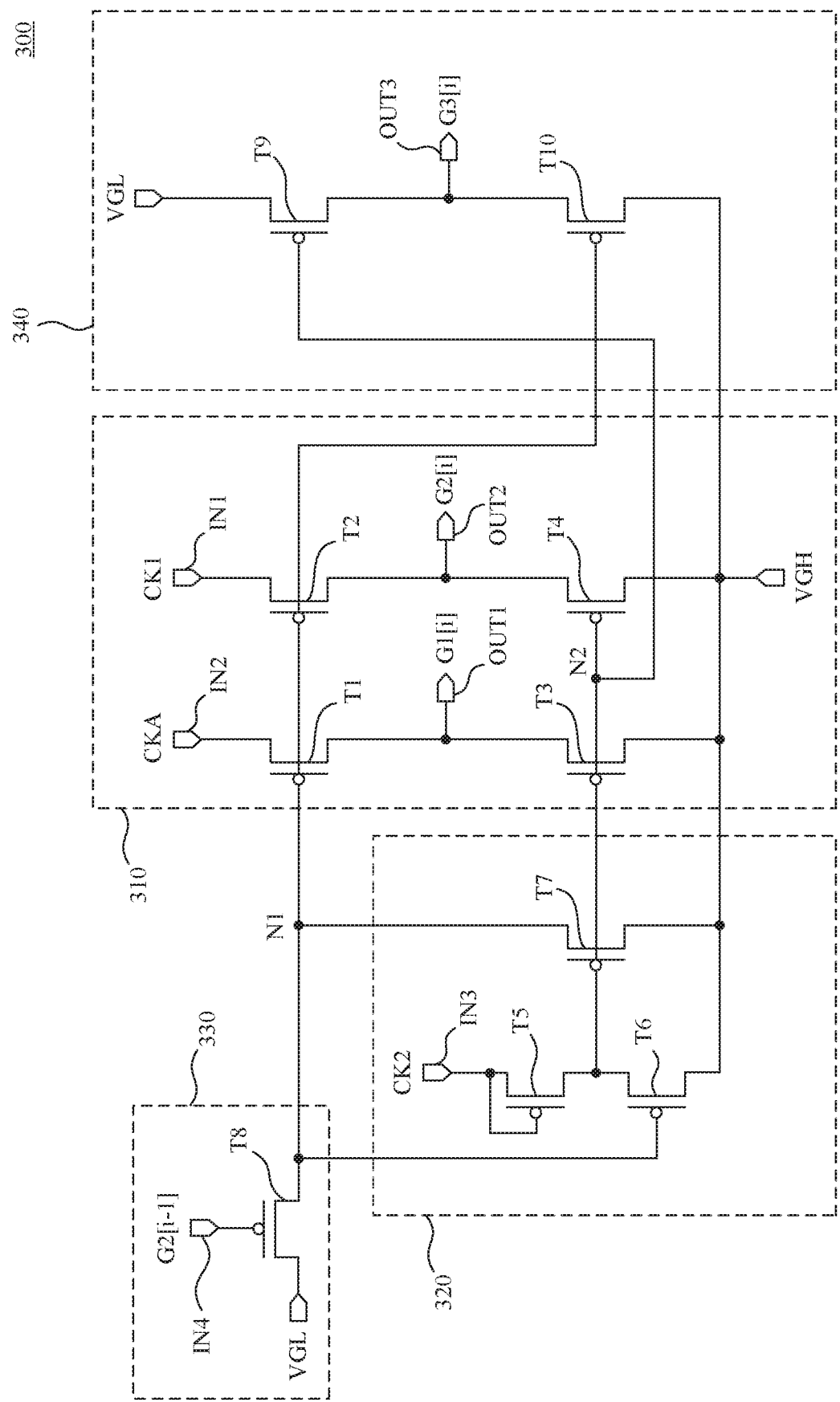
FIG. 3 is a schematic diagram of a shift register according to one embodiment of the present disclosure.

FIG. 3 is a schematic diagram of a shift register 300 according to one embodiment of the present disclosure. Each of the shift registers $210_1$-$210_n$ of FIG. 2 may be realized by the shift register 300. The shift register 300 comprises a first output circuit 310, a voltage-stabilizing control circuit 320, an input circuit 330, and a second output circuit 340. For the purpose of explanatory convenience in the following description, an example is given as using the first input node IN1, the second input node IN2, and the third input node IN3 of the shift register 300 to receive the clock signal CK1, the clock signal CKA, and the clock signal CK2, respectively.

The first output circuit 310 is coupled with the first node N1 and the second node N2, and comprises a first transistor T1, a second transistor T2, a third transistor T3, and a fourth transistor T4. A first terminal of the first transistor T1 is configured to receive a corresponding one of the second clock signal group CG2 (e.g., the clock signal CKA) through the second input node IN2. A second terminal and a control terminal of the first transistor T1 are coupled with the first output node OUT1 and the first node N1, respectively. A first terminal of the second transistor T2 is configured to receive a corresponding one of the first clock signal group CG1 (e.g., the clock signal CK1) through the first input node IN1. A second terminal and a control terminal of the second transistor T2 are coupled with the second output node OUT2 and the first node N1, respectively. A first terminal and a control terminal of the third transistor T3 are coupled with the first output node OUT1 and the second node N2, respectively, and the second terminal of the third transistor T3 is configured to receive a first reference voltage VGH. A first terminal and a control terminal of the fourth transistor T4 is coupled with the second output node OUT2 and the second node N2, respectively, and a second terminal of the fourth transistor T4 is configured to receive the first reference voltage VGH. The first output node OUT1 and the second output node OUT2 are configured to output the first control signal G1[$i$] and the second control signal G2[$i$], respectively.

The voltage-stabilizing control circuit 320 comprises a fifth transistor T5, a sixth transistor T6, and a seventh transistor T7. A first terminal and a control terminal of the fifth transistor T5 are configured to receive other corresponding one of the first clock signal group CG1 (e.g., the clock signal CK2) through the third input node IN3. A second terminal of the fifth transistor T5 is coupled with the second node N2. A first terminal and a control terminal of the sixth transistor T6 are coupled with the second node N2 and the first node N1, respectively, and a second terminal of the sixth transistor T6 is configured to receive the first reference voltage VGH. A first terminal and a control terminal of the seventh transistor T7 are coupled with the first node N1 and the second node N2, respectively, and the second terminal of the seventh transistor T7 is configured to receive the first reference voltage VGH.

In some embodiments, the voltage-stabilizing control circuit 320 may further comprise a first capacitor. A first terminal of the first capacitor is coupled with the control terminal of the seventh transistor T7, and the second terminal of the first capacitor is configured to receive the first reference voltage VGH.

The input circuit 330 comprises an eighth transistor T8. A first terminal of the eighth transistor T8 is coupled with the first node N1, and a second terminal of the eighth transistor T8 is configured to receive the second reference voltage VGL. The control terminal of the eighth transistor T8 is coupled with the fourth input node IN4, and configured to receive, through the fourth input node IN4, the second control signal G2[$i$–1] from the previous stage or to receive the vertical start signal STV.

The second output circuit 340 comprises a ninth transistor T9 and a tenth transistor T10. A first terminal of the ninth transistor T9 is configured to receive a second reference voltage VGL. A second terminal and a control terminal of the second transistor T2 are coupled with the third output node OUT3 and the second node N2, respectively. A first terminal and a control terminal of the tenth transistor T10 are coupled with the third output node OUT3 and the first node N1, respectively, and a second terminal of the tenth transistor T10 is configured to receive the first reference voltage VGH. The third output node OUT3 is configured to output the third control signal G3[$i$].

In some embodiments, the second output circuit 340 further comprises a second capacitor coupled between the control terminal of the ninth transistor T9 and the third output node OUT3.

In this embodiment, the first reference voltage VGH is higher than the second reference voltage VGL, and the first transistor T1 through the tenth transistor T10 may be realized by the P-type thin-film transistors (TFTs) or by other categories of suitable P-type transistors.

In another embodiment, the first reference voltage VGH is lower than the second reference voltage VGL, and the first transistor T1 through the tenth transistor T10 may be realized by the N-type TFTs or by other categories of suitable N-type transistors.

Figure 4:
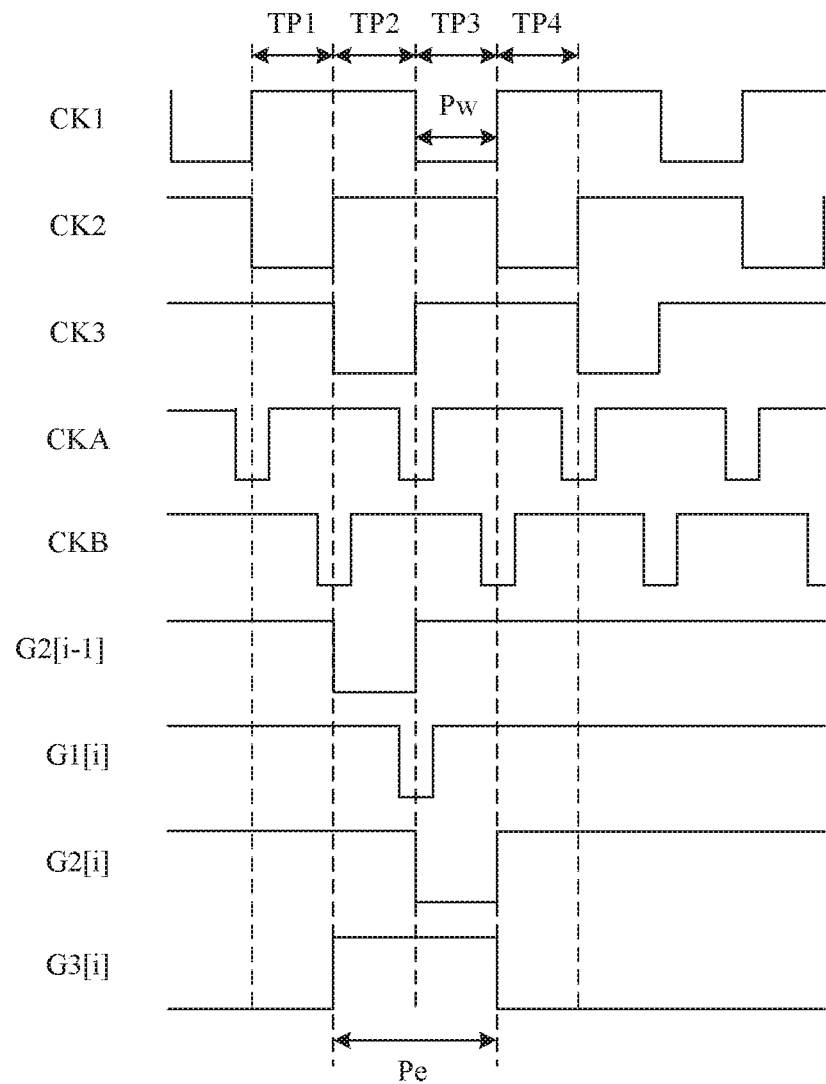
FIG. 4 is a waveform schematic of the gate driver of FIG. 2 according to one embodiment of the present disclosure.

FIG. 4 is a waveform schematic of the gate driver 200 according to one embodiment of the present disclosure. As shown in FIG. 4, in the first time period TP1, the clock signal CK1 and the clock signal CK2 have a first voltage level (e.g., high voltage level) and a second voltage level (e.g., low voltage level), respectively. The second control signal G2[$i$–1] of the previous stage have the first voltage level.

Figure 5A:
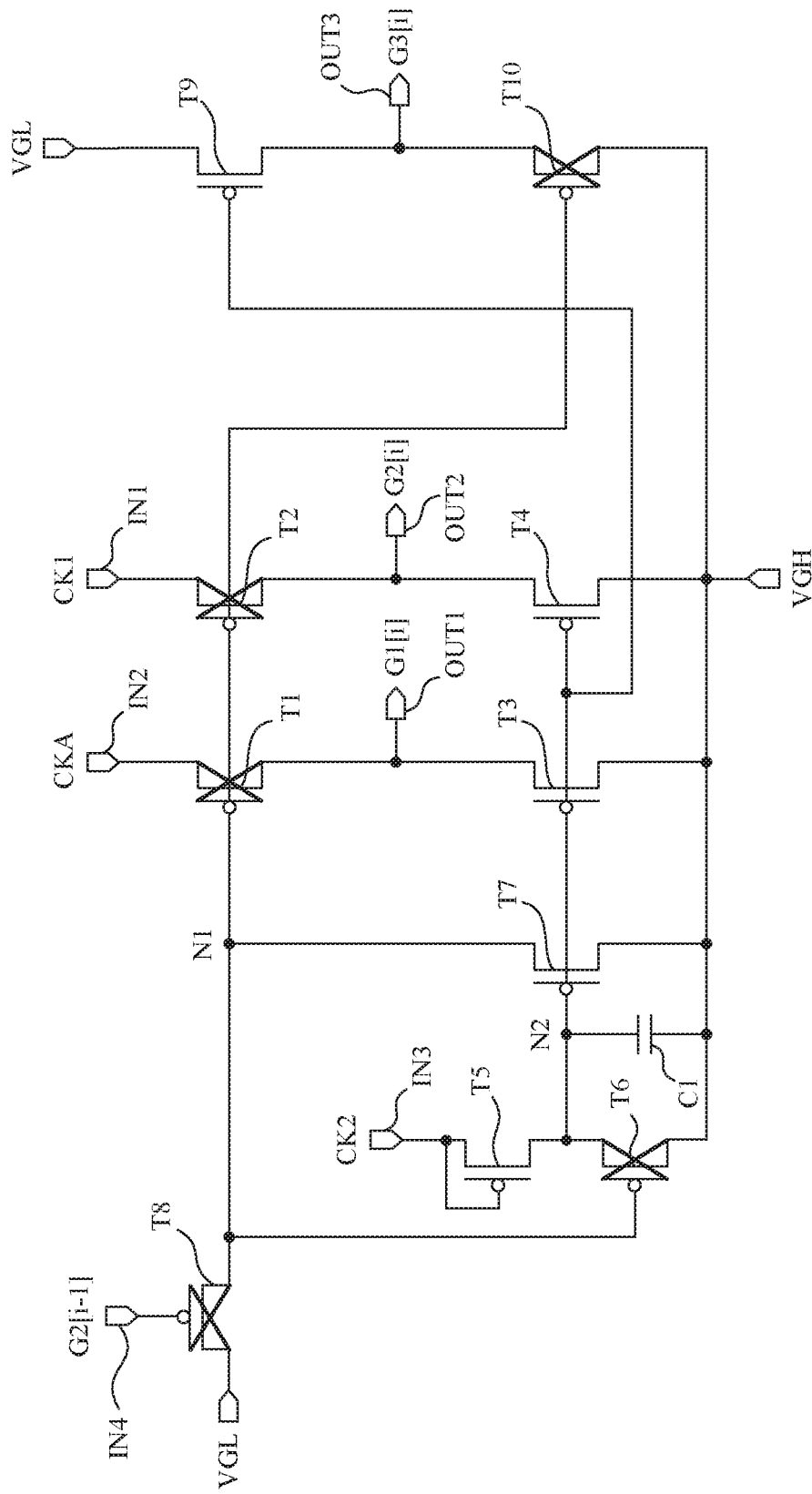
FIG. 5A is a schematic diagram of an equivalent circuit of the shift register FIG. 3 during the first time period.

FIG. 5A is a schematic diagram of an equivalent circuit of the shift register 300 during the first time period TP1. Reference is made to FIGS. 4 and 5A, the fifth transistor T5 is conducted by the clock signal CK2 so that the voltage-stabilizing control circuit 320 provides an enabling voltage (e.g., low voltage) to the second node N2. Therefore, the third transistor T3, the fourth transistor T4, the seventh transistor T7, and the ninth transistor T9 are at a conducted status.

The voltage-stabilizing control circuit 320 provides an enabling voltage (e.g. high voltage) to the first node N1 through the conducted seventh transistor T7. In this situation, since the eighth transistor T8 is switched off by the second control signal G2[$i$–1] of the previous stage, the first transistor T1, the second transistor T2, the sixth transistor T6, and the tenth transistor T10 are at a switched-off status.

As a result, the first output circuit 310 outputs the first reference voltage VGH as the first control signal G1[$i$] by the first output node OUT1, and outputs the first reference voltage VGH as the second control signal G2[$i$] by the second output node OUT2. The second output circuit 340 outputs the second reference voltage VGL as the third control signal G3[$i$] by the third output node OUT3.

In the second time period TP2 of FIG. 4, the clock signal CK1 and the clock signal CK2 both have the first voltage level. The second control signal G2[$i$–1] of the previous stage have the second voltage level.

Figure 5B:
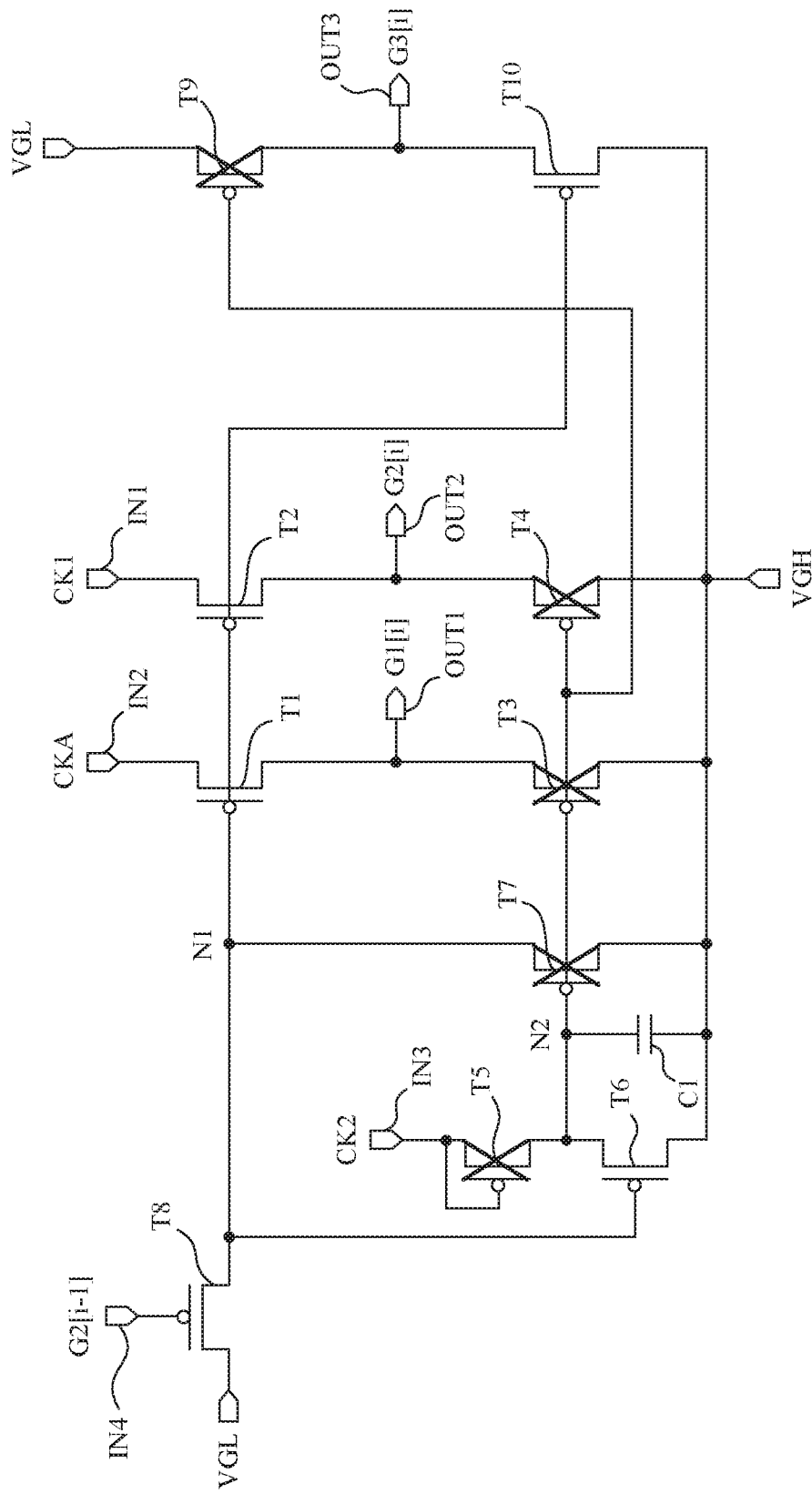
FIG. 5B is a schematic diagram of an equivalent circuit of the shift register of FIG. 3 during the second time period.

FIG. 5B is a schematic diagram of an equivalent circuit of the shift register 300 during the second time period TP2. Reference is made to FIGS. 4 and 5B, since the eighth transistor T8 is conducted by the second control signal G2[$i$–1] of the previous stage, the input circuit 330 provides the enabling voltage to the first node N1. Therefore, the first transistor T1, the second transistor T2, the sixth transistor T6, and the tenth transistor T10 are at the conducted status.

Since the fifth transistor T5 is switched by the clock signal CK2, the voltage-stabilizing control circuit 320 provides the disabling voltage to the second node N2 through the conducted sixth transistor T6. Therefore, the third transistor T3, the fourth transistor T4, the seventh transistor T7, and the ninth transistor T9 are at the switched-off status.

As a result, the first output circuit 310 outputs the clock signal CKA as the first control signal G1[i] by the first output node OUT1, and outputs the clock signal CK1 as the second control signal G2[i] by the second output node OUT2. The second output circuit 340 outputs the first reference voltage VGH as the third control signal G3[i] by the third output node OUT3.

In the third time period TP3 of FIG. 4, the clock signal CK1 and the clock signal CK2 have the second voltage level and the first voltage level, respectively. The second control signal G2[i-1] of the previous stage has the first voltage level.

Figure 5C:
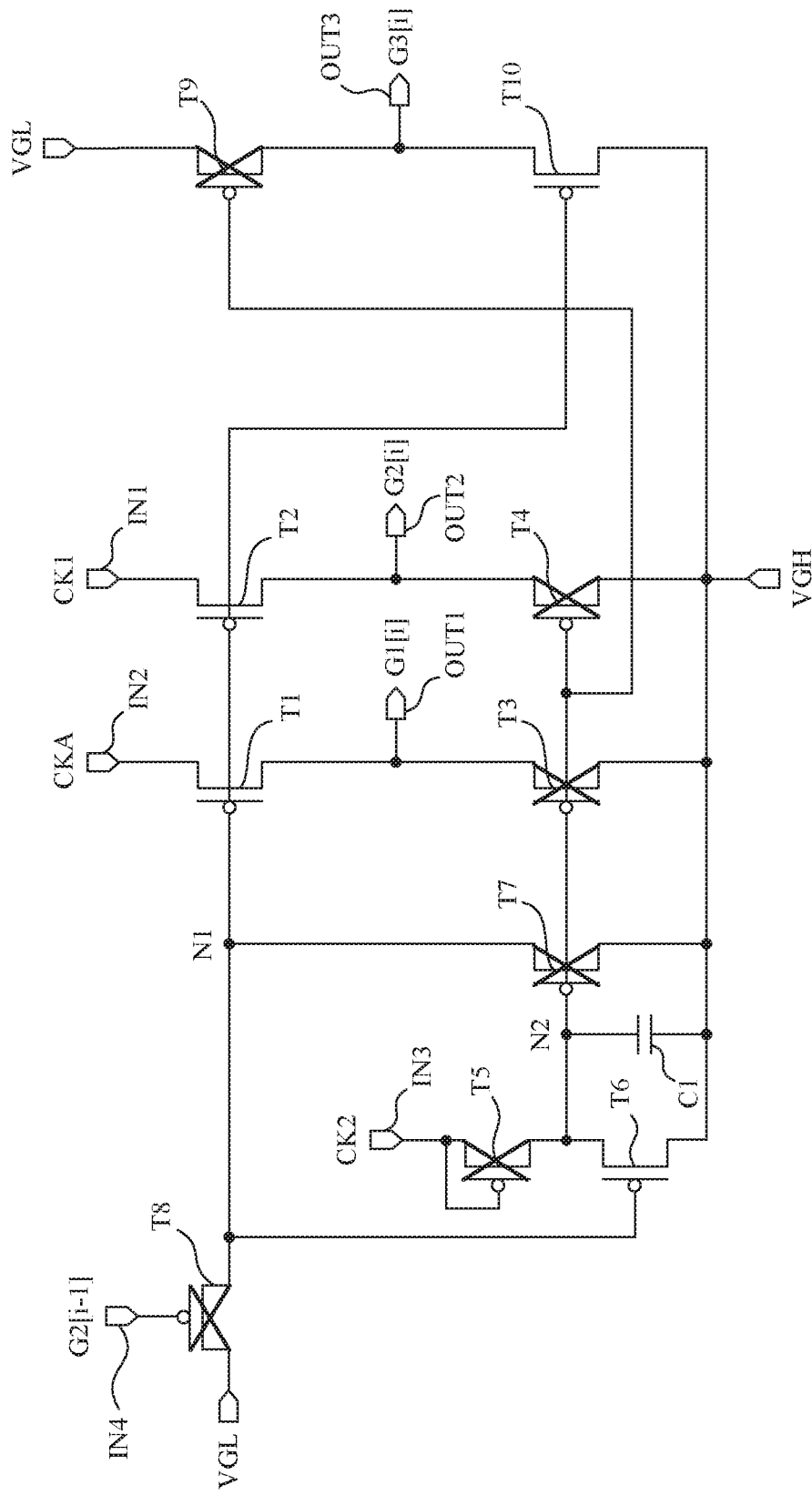
FIG. 5C is a schematic diagram of an equivalent circuit of the shift register FIG. 3 during the third time period.

FIG. 5C is a schematic diagram of an equivalent circuit of the shift register 300 during the third time period TP3. Reference is made to FIGS. 4 and 5C, the equivalent circuit of the shift register 300 in the third time period TP3 is similar to that in the second time period TP2, and the difference is that the eighth transistor T8 is switched from the conducted status to the switched-off status in the third time period T3, so that the first node N1 is maintained at the enabling voltage and the second node N2 is maintained at the disabling voltage.

Therefore, the first output circuit 310 outputs the clock signal CKA and the clock signal CK1 as the first control signal G1[i] and the second control signal G2[i], respectively. The second output circuit 340 outputs the first reference voltage VGH as the third control signal G3[i] by the third output node OUT3.

In the fourth time period TP4 of FIG. 4, the clock signal CK1 and the clock signal CK2 have the first voltage level and the second voltage level, respectively. The second control signal G2[i-1] of the previous stage has the first voltage level. The equivalent circuit of the shift register 300 in the fourth time period TP4 is the same as that in the first time period TP1. For the sake of brevity, those descriptions will not be repeated here.

As can be appreciated from the forgoing descriptions, when the enabling voltage is provided to the first node N1, the first output circuit 310 outputs the corresponding one of the first clock signal group CG1 as the second control signal G2[i], and also outputs the corresponding one of the second clock signal group CG2 as the first control signal G1[i]. In this situation, the second output circuit 340 outputs the first reference voltage VGH as the third control signal G3[i].

On the other hand, when the disabling voltage is provided to the first node N1, the first output circuit 310 outputs the first reference voltage VGH as the first control signal G1[i] and the second control signal G2[i]. In this situation, the second output circuit 340 outputs the second reference voltage VGL as the third control signal G3[i].

In addition, as shown in FIG. 4, when the third control signal G3[i] has the second voltage level, the second control signal G2[i-1] of the previous stage, the first control signal G1[i], and the second control signal G2[i] have the first voltage level. When the third control signal G3[i] has the first voltage level, the second control signal G2[i-1] of the previous stage, the first control signal G1[i], and the second control signal G2[i] are sequentially switched from the first voltage level to the second voltage level.

Besides, the third control signal G3[i] is maintained at the first voltage level for a predetermined time length Pe, and predetermined time length Pe is twice as the pulse width Pw of any one of the first clock signal group CG1 having the second voltage level. By respectively dividing the time lengths in which the first control signal G1[i], the second control signal G2[i], and the third control signal G3[i] having the second voltage level to the same period, it can be noticed that the third control signal G3[i], the second control signal G2[i], and the first control signal G1[i] have the largest duty ratio, the second largest duty ratio, and the smallest duty ratio, respectively.

Accordingly, the shift register 300 is capable of generating signal(s) maintained at the first voltage level for a long time period (e.g., the first control signal G1[i] and the second control signal G2[i]), and also capable of generating signal (s) maintained at the second voltage level for a long time period (e.g., the third control signal G3[i]). In contrast, conventional technology needs different shift registers to generate different signals respectively maintained at different voltage levels for long time periods. Therefore, the shift register 300 has advantages of simple structure and small circuit area.

Figure 6:
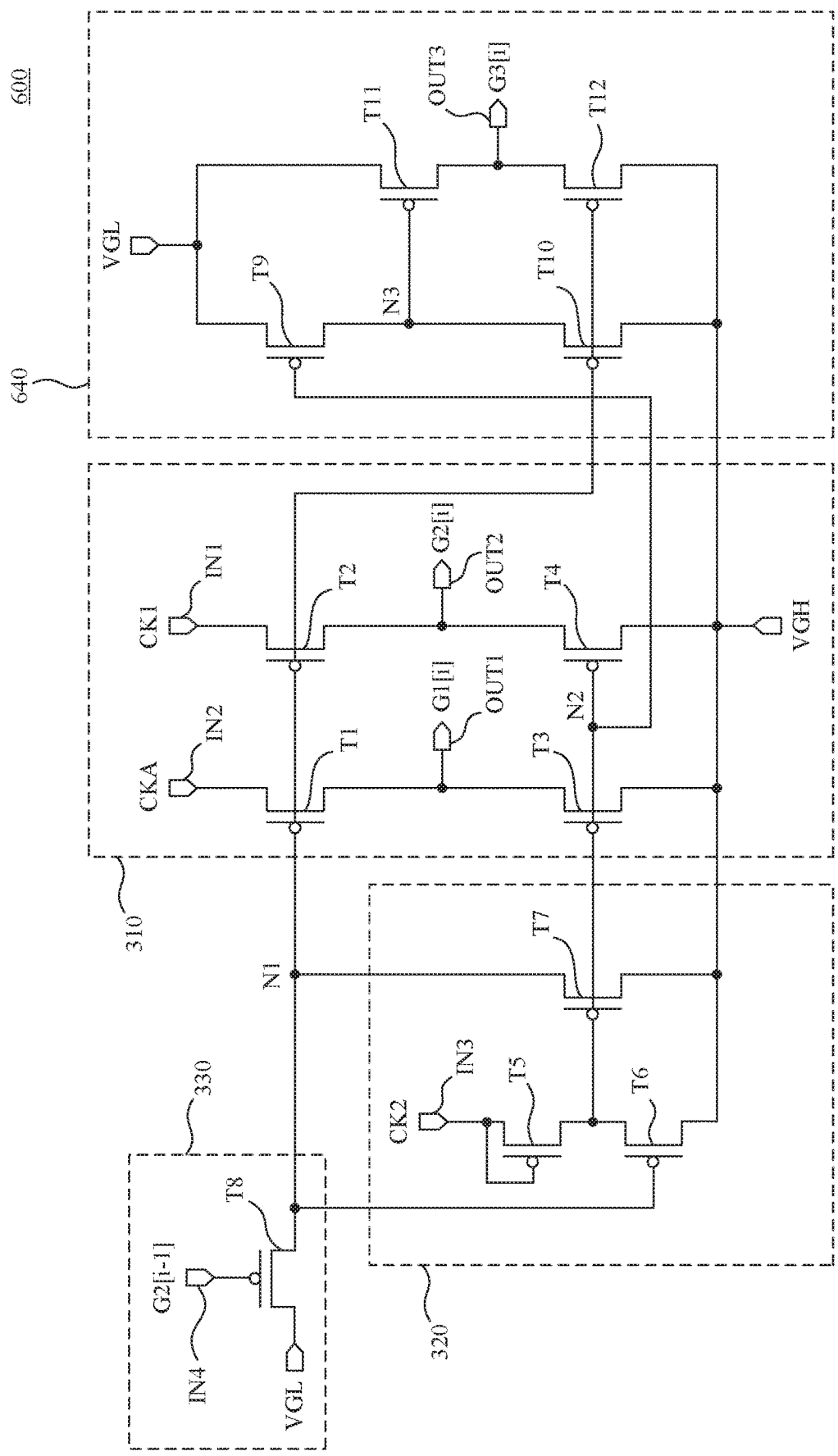
FIG. 6 is a schematic diagram of a shift register according to one embodiment of the present disclosure.

FIG. 6 is a schematic diagram of a shift register 600 according to one embodiment of the present disclosure. Each of the shift registers $210_1$-$210_n$ of FIG. 2 may be realized by the shift register 600. The shift register 600 is similar to the shift register 300, and the difference is that the shift register 600 uses the second output circuit 640 to output the third control signal G3[i].

The second output circuit 640 comprises a ninth transistor T9, the tenth transistor T10, the eleventh transistor T11, and the twelfth transistor T12. A first terminal of the ninth transistor T9 is configured to receive the second reference voltage VGL. A second terminal and a control terminal of the ninth transistor T9 are coupled with the third node N3 and the second node N2, respectively. A first terminal and a control terminal of the tenth transistor T10 are coupled with the third node N3 and the first node N1, respectively, and a second terminal of the tenth transistor T10 is configured to receive the first reference voltage VGH. A first terminal of the eleventh transistor T11 is configured to receive the second reference voltage VGL. A second terminal and a control terminal of the eleventh transistor T11 are coupled with the third output node OUT3 and the third node N3, respectively. A first terminal and a control terminal of the twelfth transistor T12 are coupled with the third output node OUT3 and the first node N1, respectively, and a second terminal of the twelfth transistor T12 is configured to receive the first reference voltage VGH. The third output node OUT3 is configured to output the third control signal G3[i].

The foregoing descriptions regarding other corresponding implementations, connections, operations, and related advantages of the shift register 300 are also applicable to the shift register 600. For the sake of brevity, those descriptions will not be repeated here.

In some embodiments, the control terminal of the eighth transistor T8 of each of the shift register 300 and the shift register 600 receives the first control signal G1[i-1] of the previous stage through the fourth input node IN4.

In other embodiments, the second terminal and the control terminal of the eighth transistor T8 of each of the shift register 300 and the shift register 600 are both coupled with the fourth input node IN4, so as to receive, through the fourth input node IN4, the first control signal G1[i-1] of the previous stage or the second control signal G2[i-1].

In yet other embodiments, the first terminal of the fifth transistor T5 of each of the shift register 300 and the shift register 600 is configured to receive the second reference voltage VGL, and the control terminal of the fifth transistor T5 is coupled with the third input node IN3.

Figure 7:
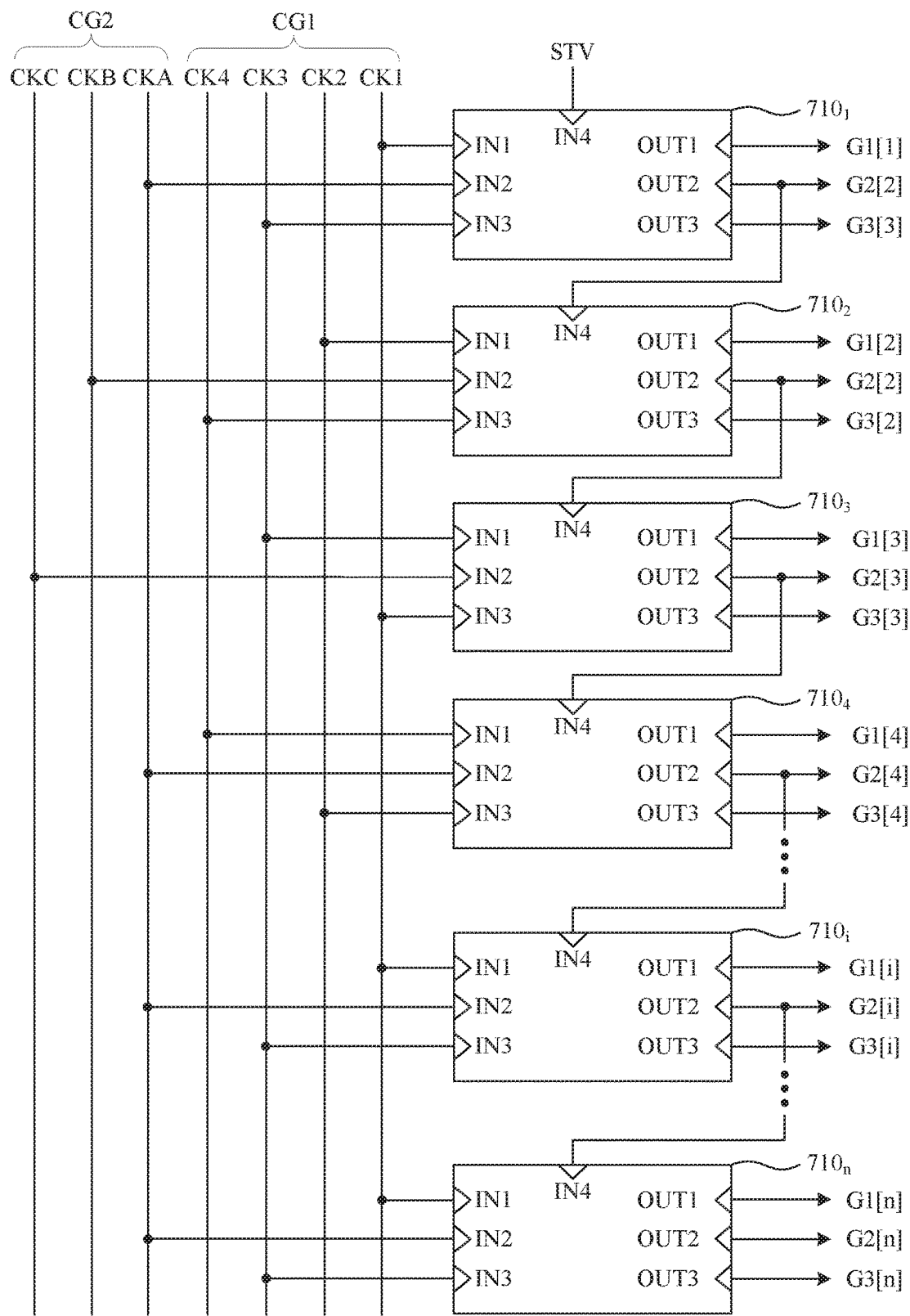
FIG. 7 is a simplified functional block diagram of a gate driver according to one embodiment of the present disclosure.

FIG. 7 is a simplified functional block diagram of a gate driver 700 according to one embodiment of the present disclosure. Each of the first gate driver 130a and the second gate driver 130b of FIG. 1 can be realized by the gate driver 700. The gate driver 700 comprises a plurality of shift registers $710_1$-$710_n$, and is configured to output first control signals G1[1]-G1[n], second control signals G2[1]-G2[n], and third control signals G3[1]-G3[n], wherein these control signals may be used to control the pixel circuits PX of FIG. 1. Each of the shift registers $710_1$-$710_n$ comprises a first input node IN1, a second input node IN2, a third input node IN3, a fourth input node IN4, a first output node OUT1, a second output node OUT2, and the third output node OUT3.

In some embodiments, each of the shift registers $710_1$-$710_n$ may be realized by the shift register 300 of FIG. 3 or by the shift register 600 of FIG. 6.

Take shift register $710_i$ (i.e., the i-th stage shift register) as an example, the first output node OUT1, the second output node OUT2, and the third output node OUT3 of the shift register $710_i$ are configured to output the first control signal G1[i], the second control signal G2[i], and the third control signal G3[i], respectively, wherein i and n are positive integers and i is smaller than or equal to n. The first input node IN1 of the shift register $710_i$ is configured to receive a corresponding one of the first clock signal group CG1. The second input node IN2 of the shift register $710_i$ is configured to receive a corresponding one of the second clock signal group CG2. The third input node IN3 of the shift register $710_i$ is configured to receive other corresponding one of the first clock signal group CG1. The fourth input node IN4 of the shift register $710_i$ is configured to receive the second control signal G2[i−1] of the shift register $710_{i−1}$.

In an embodiment, the fourth input node IN4 of the shift register $710_i$ is configured to receive the first control signal G1[i−1] of the shift register $710_{i−1}$.

In addition, if i is set to 1, the fourth input node IN4 of the shift register $710_i$ is configured to receive the vertical start signal STV.

In this embodiment, the first clock signal group CG1 comprises a clock signal CK1, a clock signal CK2, a clock signal CK3, and a clock signal CK4. The second clock signal group CG2 comprises a clock signal CKA, a clock signal CKB, and a clock signal CKC. When I is set to a multiple of 4, the first input node IN1 is configured to receive the clock signal CK4, and the third input node IN3 is configured to receive the clock signal CK2. When i is set to (4×+3), the first input node IN1 is configured to receive the clock signal CK3, and the third input node IN3 is configured to receive the clock signal CK1, wherein x is an integer larger than or equal to 0. When i is set to (4×+2), the first input node IN1 is configured to receive the clock signal CK2, and the third input node IN3 is configured to receive the clock signal CK4. When i is set to (4×+1), the first input node IN1 is configured to receive the clock signal CK1, and the third input node IN3 is configured to receive the clock signal CK3.

In addition, when i is set to a multiple of 3, the second input node IN2 is configured to receive the clock signal CKC. When i is set to (3×+2), the second input node IN2 is configured to receive the clock signal CKB. When i is set to (3×+1), the second input node IN2 is configured to receive the clock signal CKA.

Figure 8:
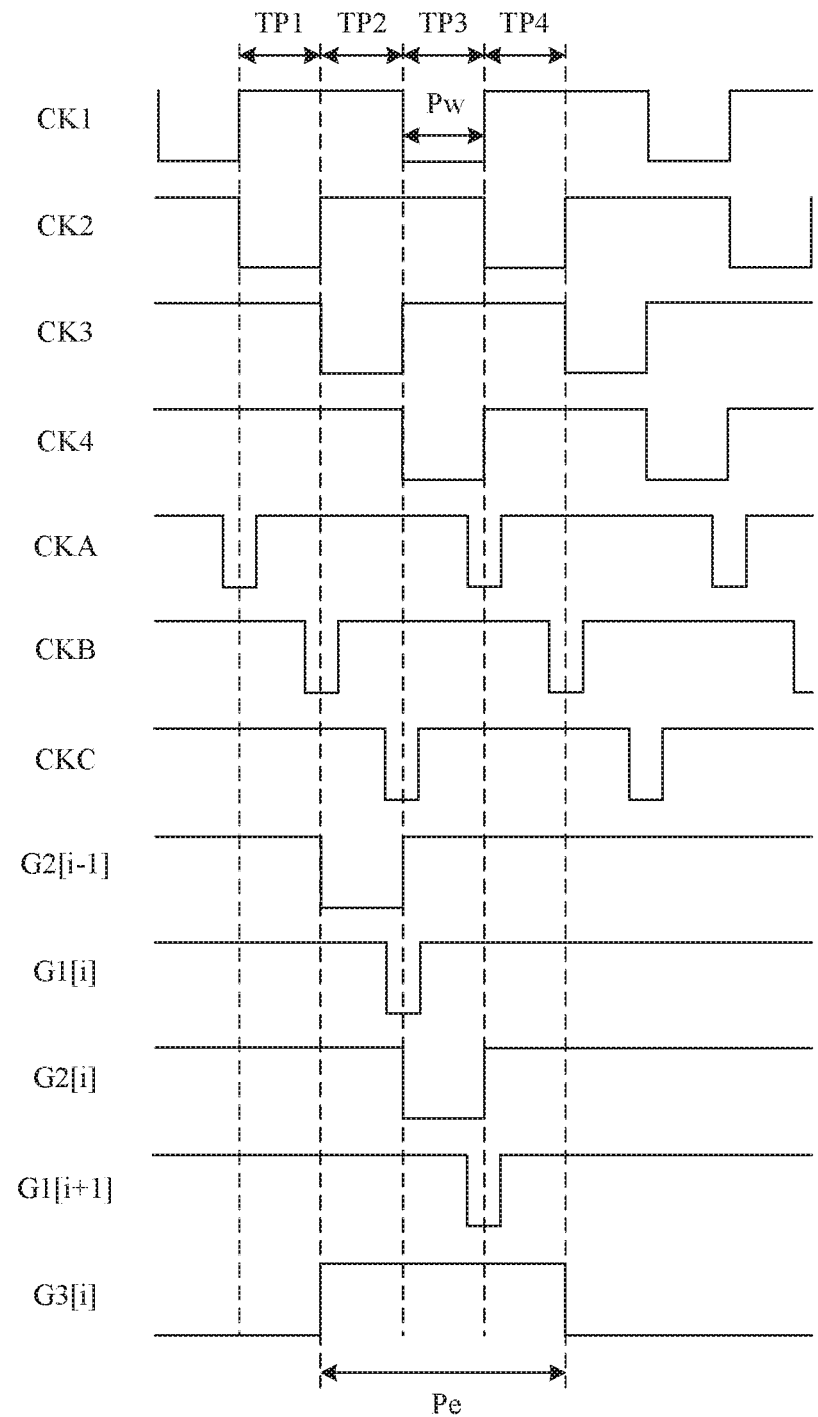
FIG. 8 is a waveform schematic of the gate driver of FIG. 7 according to one embodiment of the present disclosure.

FIG. 8 is a waveform schematic of the gate driver 700 according to one embodiment of the present disclosure. As shown in FIG. 8, when the third control signal G3[i] of the shift register $710_i$ has the second voltage level (e.g., low voltage level), the second control signal G2[i−1] of the previous stage, the first control signal G1[i], the second control signal G2[i], and the first control signal G1[i+1] of the next stage have the first voltage level (e.g., high voltage level).

In addition, when the third control signal G3[i] has the first voltage level, the second control signal G2[i−1] of the previous stage, the first control signal G1[i], the second control signal G2[i], and the first control signal G1[i+1] of the next stage are switched sequentially from the first voltage level to the second voltage level.

In addition, the third control signal G3[i] is maintained at the first voltage level for a predetermined time length Pe, and the predetermined time length Pe is three times as the pulse width Pw of any one of the first clock signal group CG1 having the second voltage level.

In some embodiments, when the third control signal G3[i] has the first voltage level, the corresponding pixel circuits PX of FIG. 1 may stop emitting to update internal node voltage(s) thereof. When the third control signal G3[i] has the second voltage level, the corresponding pixel circuits PX of FIG. 1 may emit. In a situation that the predetermined time length Pe is set to be longer, the pixel circuits PX have longer operating time so that additional controls signal(s) (e.g., the first control signal G1[i+1] of the next stage) may be used by the pixel circuits PX to conduct additional operations (e.g., discharging residual charges in OLED emitting element). As a result, the display quality of the electronic device 100 is increased.

Figure 9:
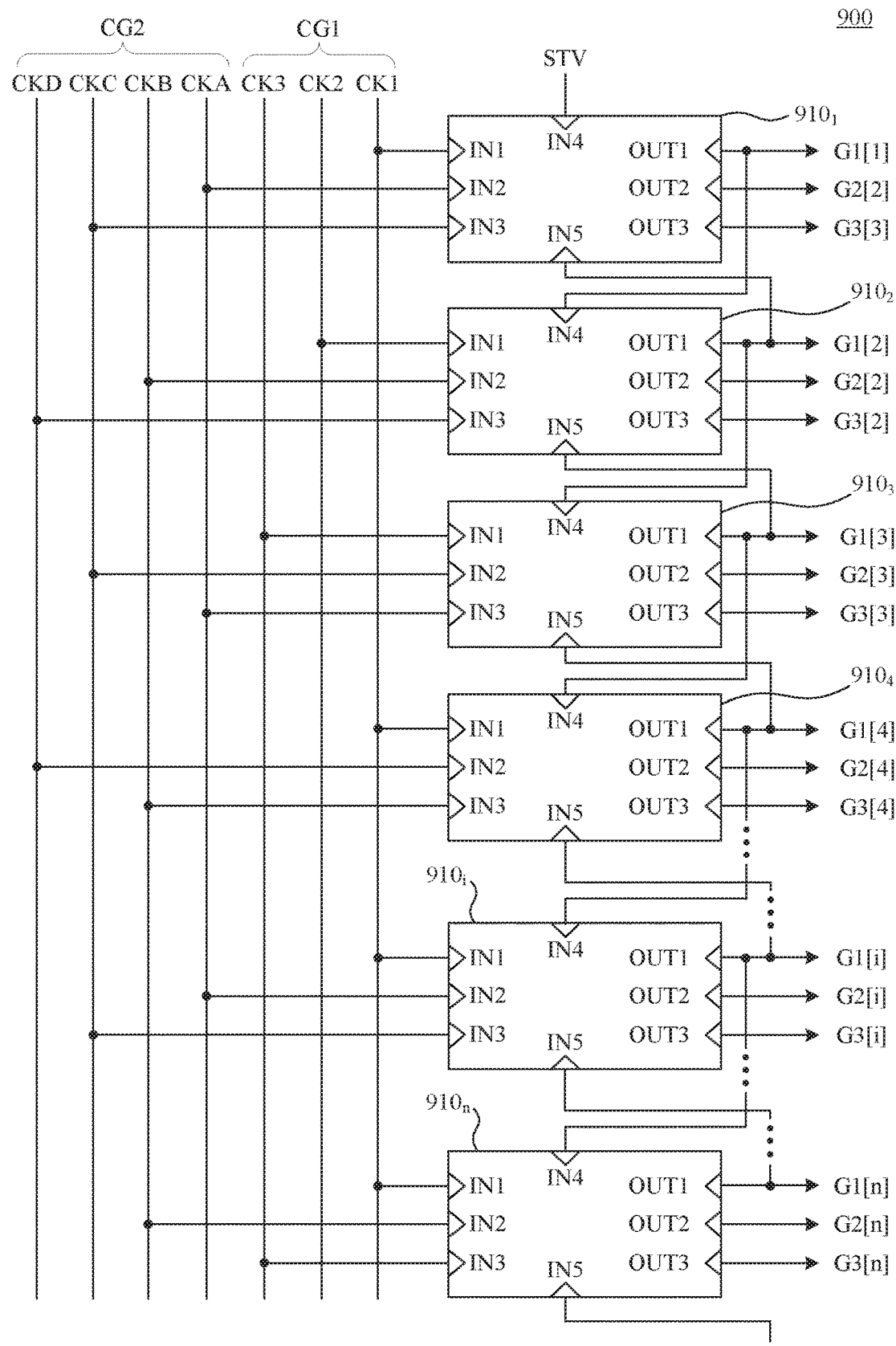
FIG. 9 is a simplified functional block diagram of a gate driver according to one embodiment of the present disclosure.

FIG. 9 is a simplified functional block diagram of a gate driver 900 according to one embodiment of the present disclosure. Each of the first gate driver 130a and the second gate driver 130b of FIG. 1 may be realized by the gate driver 900. The gate driver 900 comprises a plurality of shift registers $910_1$-$910_n$, and is configured to output first control signals G1[1]-G1[n], second control signals G2[1]-G2[n], and third control signals G3[1]-G3[n], and these control signals may be used to control the pixel circuits PX of FIG. 1. Each of the shift registers $910_1$-$910_n$ comprises a first input node IN1, a second input node IN2, a third input node IN3, a fourth input node IN4, a fifth input node IN5, a first output node OUT1, a second output node OUT2, and a third output node OUT3.

Take shift register $910_i$ (i.e., the i-th stage shift register) as an example, the first output node OUT1, the second output node OUT2, and the third output node OUT3 of the shift register $910_i$ are configured to output the first control signal G1[i], the second control signal G2[i], and the third control signal G3[i], respectively, wherein i and n are positive integers and i is smaller than or equal to n. The first input node IN1 of the shift register $910_i$ is configured to receive a corresponding one of the first clock signal group CG1. The second input node IN2 of the shift register $910_i$ is configured to receive a corresponding one of the second clock signal group CG2. The third input node IN3 of the shift register $910_i$ is configured to receive other corresponding one of the second clock signal group CG2. The fourth input node IN4 of the shift register $910_i$ is configured to receive the first control signal G1[i−1] of the shift register $910_{i−1}$. The fifth input node IN5 of the shift register $910_i$ is configured to receive the first control signal G1[i+1] of the shift register $910_{i+1}$.

In addition, if i is set to 1, the fourth input node IN4 of the shift register $910_1$ is configured to receive the vertical start signal STV.

In this embodiment, the first clock signal group CG1 comprises a clock signal CK1, a clock signal CK2, and a clock signal CK3. The second clock signal group CG2 comprises a clock signal CKA, a clock signal CKB, a clock signal CKC, and a clock signal CKD. When i is set to a multiple of 3, the first input node IN1 is configured to receive the clock signal CK3. When i is set to (3×+2), the first input node IN1 is configured to receive the clock signal CK2, and x is an integer larger than or equal to 0. When i is set to (3×+1), the first input node IN1 is configured to receive the clock signal CK1.

Additionally, when i is set to a multiple of 4, the second input node IN2 is configured to receive the clock signal CKD, and the third input node IN3 is configured to receive the clock signal CKB. When i is set to (4×+3), the second input node IN2 is configured to receive the clock signal CKC, and the third input node IN3 is configured to receive the clock signal CKA. When i is set to (4×+2), the second input node IN2 is configured to receive the clock signal CKB, and the third input node IN3 is configured to receive the clock signal CKD. When i is set to (4×+1), the second input node IN2 is configured to receive the clock signal CKA, and the third input node IN3 is configured to receive the clock signal CKC.

Figure 10:
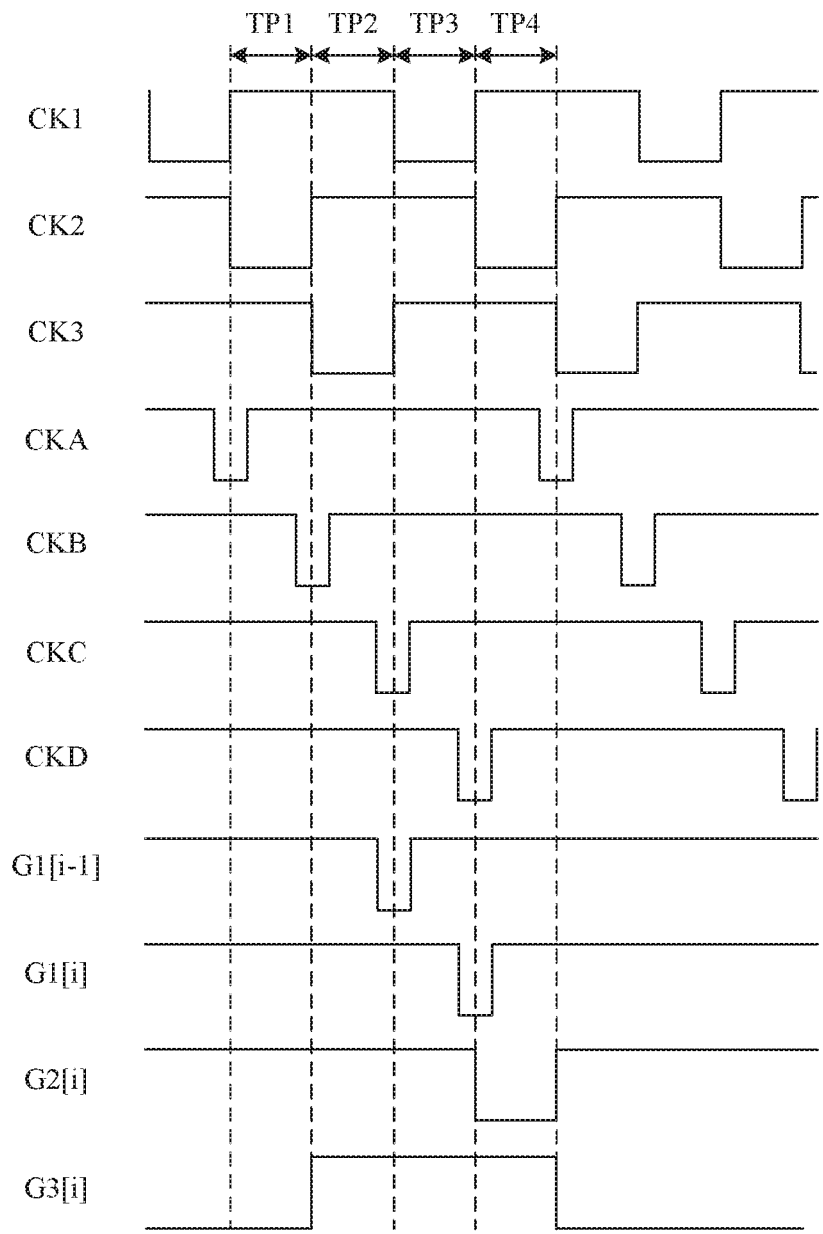
FIG. 10 is a waveform schematic of the gate driver of FIG. 9 according to one embodiment of the present disclosure.

FIG. 10 is a waveform schematic of the gate driver 900 according to one embodiment of the present disclosure. As shown in FIG. 10, when the third control signal G3[$i$] of the shift register $910_i$ has the second voltage level (e.g., low voltage level), the first control signal G1[$i$−1] of the previous stage, the first control signal G1[$i$], and the second control signal G2[$i$] have the first voltage level (e.g., high voltage level).

Additionally, when the third control signal G3[$i$] has the first voltage level, the first control signal G1[$i$−1] of the previous stage, the first control signal G1[$i$], and the control signal G2[$i$−1] are switched sequentially from the first voltage level to the second voltage level.

Figure 11:
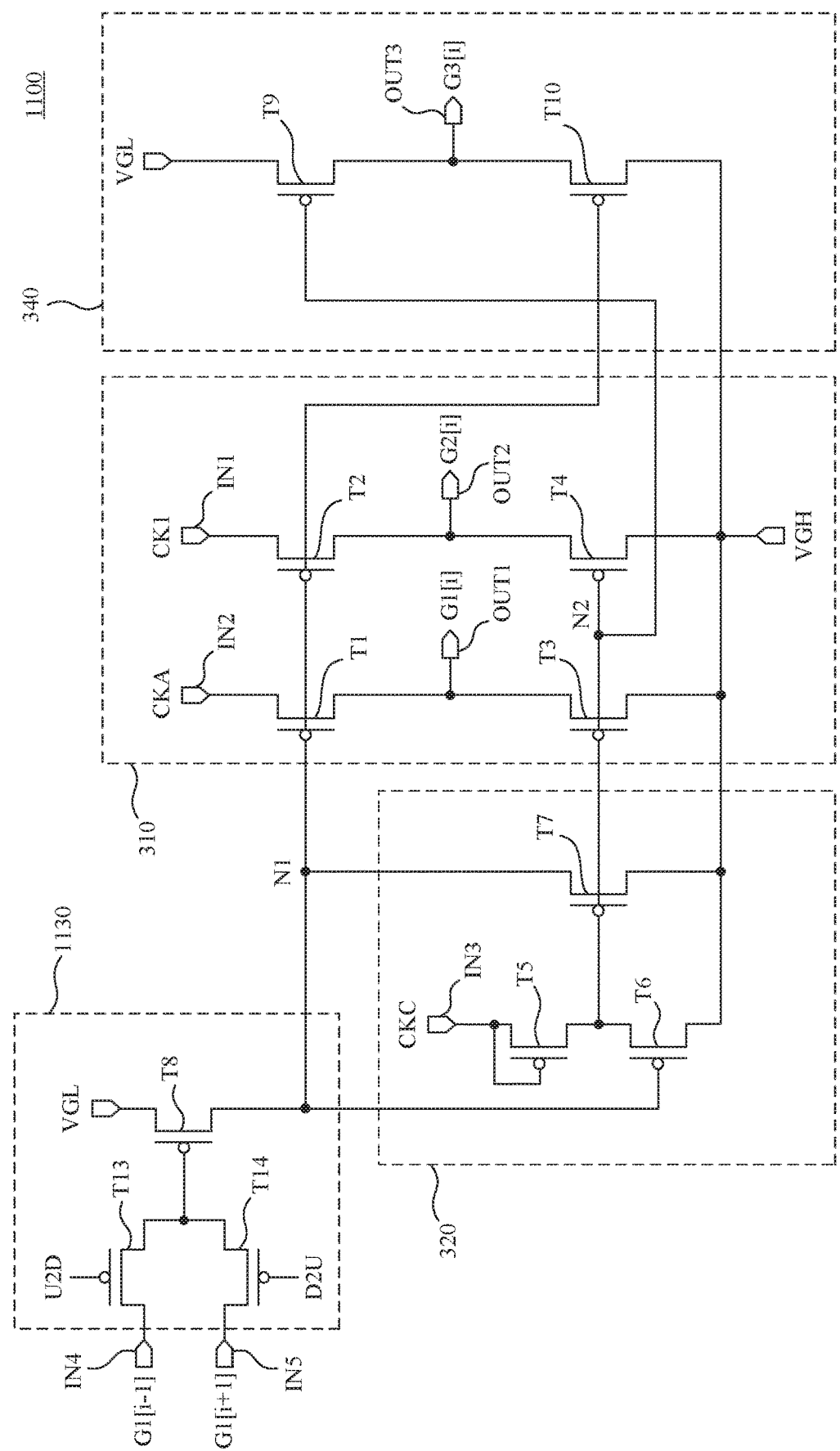
FIG. 11 is a schematic diagram of a shift register according to one embodiment of the present disclosure.

FIG. 11 is a schematic diagram of a shift register 1100 according to one embodiment of the present disclosure. Each of the shift registers $910_1$-$910_n$ can be realized by the shift register 1100. For the purpose of explanatory convenience in the following description, an example is given as using the first input node IN1, the second input node IN2, the third input node IN3 of the shift register 1100 to receive the clock signal CK1, the clock signal CKA, and the clock signal CKC, respectively.

The shift register 1100 is similar to the shift register 300, the difference is that the shift register 1100 uses the input circuit 1130 to set the voltage of the first node N1. The input circuit 1130 comprises an eighth transistor T8, a thirteenth transistor T13, and a fourteenth transistor T14, and each of the eighth transistor T8, the thirteenth transistor T13, and the fourteenth transistor T14 comprises a first terminal, a second terminal, and a control terminal. The first terminal of the eighth transistor T8 is coupled with the first node N1, and the second terminal of the eighth transistor is configured to receive to the second reference voltage VGL. The first terminal of the thirteenth transistor T13 is coupled with the control terminal of the eighth transistor T8. The second terminal of the thirteenth transistor T13 is configured to receive the first control signal G1[$i$−1] of the previous stage through the fourth input node IN4. The control terminal of the thirteenth transistor T13 is configured to receive a first direction signal U2D. The first terminal of the fourteenth transistor T14 is coupled with the control terminal of the eighth transistor T8. The second terminal of the fourteenth transistor is configured to receive the first control signal G1[$i$+1] of the nest stage through the fifth input node IN5. The control terminal of the fourteenth transistor T14 is configured to receive a second direction signal D2U.

In this embodiment, the first direction signal U2D and the second direction signal D2U are opposite to each other.

In an embodiment that each of the shift registers $910_1$-$910_n$ is realized by the shift register 1100, the first direction signal U2D and the second direction signal D2U are used to control the scanning direction of the shift registers $910_1$-$910_n$. For example, when the first direction signal U2D has a low voltage level, the second direction signal D2U has a high voltage level and the shift registers $910_1$-$910_n$ output control signals starting from the shift register $910_1$. As another example, when the first direction signal U2D has the high voltage level, the second direction signal D2U has the low voltage level and the shift registers $910_1$-$910_n$ output control signals starting from the shift register $910_n$.

As shown in FIGS. 10 and 11, the shift register 1100 outputs clock signal CK1 as the second control signal G2[$i$]. In some applications that requires frame rate reduction, the second control signal G2[$i$] can be maintained at the high voltage level by reducing the frequency of the clock signal CK1. As a result, the pixel circuits PX of FIG. 1 may temporary stop updating internal node voltage(s) thereof to reduce power consumption.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electronic device, comprising:
   an active area, comprising a plurality of pixel circuits; and
   a plurality of shift registers, wherein each of the plurality of shift registers is configured to output a first control signal, a second control signal, and a third control signal, switched between a first voltage level and a second voltage level, to a part of pixel circuits of the plurality of pixel circuits, wherein a duty ratio of the second voltage level of the third control signal is greater than a duty ratio of the second voltage level of the second control signal, and the duty ratio of the second voltage level of the second control signal is greater than a duty ratio of the second voltage level of the first control signal, wherein a part of the plurality of shift registers and other part of the plurality of shift registers are substantially symmetrically disposed at two sides of the active area, respectively, and when the third control signal is at the second voltage level, the first control signal and the second control signal remain at the first voltage level.

2. The electronic device of claim 1, further comprising a through hole, wherein the plurality of pixel circuits are arranged as surrounding the through hole.

3. The electronic device of claim 1, wherein each of the plurality of shift registers comprises:

a first output circuit, comprising a first node, wherein when an enabling voltage is provided to first node, the first output circuit outputs a corresponding one of a first clock signal group as the second control signal, and outputs a corresponding one of a second clock signal group as the first control signal, wherein a duty ratio of the first clock signal group is different from a duty ratio of the second clock signal group;

a second output circuit, wherein when the enabling voltage is provided to the first node, the second output circuit outputs a first reference voltage as the third control signal, and when an disabling voltage is provided to the first node, the second output circuit outputs a second reference voltage as the third control signal;

an input circuit, configured to provide the enabling voltage to the first node; and a voltage-stabilizing control circuit, configured to provide the disabling voltage to the first node according to other corresponding one of the first clock signal group.

4. The electronic device of claim 3, wherein the first output circuit comprises:

a first transistor, comprising a first terminal, a second terminal, and a control terminal, wherein the first terminal of the first transistor is configured to receive the corresponding one of the second clock signal group, the second terminal of the first transistor is coupled with a first output node, and the control terminal of the first transistor is coupled with the first node;

a second transistor, comprising a first terminal, a second terminal, and a control terminal, wherein the first terminal of the second transistor is configured to receive the corresponding one of the first clock signal group, the second terminal of the second transistor is coupled with a second output node, and the control terminal of the second transistor is coupled with the first node;

a third transistor, comprising a first terminal, a second terminal, and a control terminal, wherein the first terminal of the third transistor is coupled with the first output node, the second terminal of the third transistor is configured to receive the first reference voltage, and the control terminal of the third transistor is coupled with a second node; and a fourth transistor, comprising a first terminal, a second terminal, and a control terminal, wherein the first terminal of the fourth transistor is coupled with the second output node, the second terminal of the fourth transistor is configured to receive the first reference voltage, and the control terminal of the fourth transistor is coupled with the second node, wherein the first output node and the second output node are configured to output the first control signal and the second control signal, respectively.

5. The electronic device of claim 4, wherein the voltage-stabilizing control circuit comprises:

a fifth transistor, comprising a first terminal, a second terminal, and a control terminal, wherein the first terminal of the fifth transistor is configured to receive the other corresponding one of the first clock signal group or the second reference voltage, the control terminal of the fifth transistor is configured to receive the other corresponding one of the first clock signal group, and the second terminal of the fifth transistor is coupled with the second node;

a sixth transistor, comprising a first terminal, a second terminal, and a control terminal, wherein the first terminal of the sixth transistor is coupled with the second node, the second terminal of the sixth transistor is configured to receive the first reference voltage, and the control terminal of the sixth transistor is coupled with the first node; and a seventh transistor, comprising a first terminal, a second terminal, and a control terminal, wherein the first terminal of the seventh transistor is coupled with the first node, the second terminal of the seventh transistor is configured to receive the first reference voltage, and the control terminal of the seventh transistor is coupled with the second node.

6. The electronic device of claim 5, wherein the input circuit comprises:

an eighth transistor, comprising a first terminal, a second terminal, and a control terminal, wherein the first terminal of the eighth transistor is coupled with the first node, the control terminal of the eighth transistor is configured to receive the first control signal of a previous-stage shift register or to receive the second control signal of the previous-stage shift register, wherein the second terminal of the eighth transistor is coupled with the control terminal of the eighth transistor, or configured to receive the second reference voltage.

7. The electronic device of claim 6, wherein the second output circuit comprises:

a ninth transistor, comprising a first terminal, a second terminal, and a control terminal, wherein the first terminal of the ninth transistor is configured to receive the second reference voltage, the control terminal of the ninth transistor is coupled with the second node; and a tenth transistor, comprising a first terminal, a second terminal, and a control terminal, wherein the first terminal of the tenth transistor is coupled with the second terminal of the ninth transistor, the second terminal of the tenth transistor is configured to receive the first reference voltage, and the control terminal of the tenth transistor is coupled with the first node.

8. The electronic device of claim 7, wherein the second output circuit further comprises:

an eleventh transistor, comprising a first terminal, a second terminal, and a control terminal, wherein the first terminal of the eleventh transistor is configured to receive the second reference voltage, and the control terminal of the eleventh transistor is coupled with the second terminal of the ninth transistor; and a twelfth transistor, comprising a first terminal, a second terminal, and a control terminal, wherein the first terminal of the twelfth transistor is coupled with the second terminal of the eleventh transistor, the second terminal of the twelfth transistor is configured to receive the first reference voltage, and the control terminal of the twelfth transistor is coupled with the first node.

9. The electronic device of claim 5, wherein the input circuit comprises:
an eighth transistor, comprising a first terminal, a second terminal, and a control terminal, wherein the first terminal of the eighth transistor is coupled with the first node, and the second terminal of the eighth transistor is configured to receive the second reference voltage;
a thirteenth transistor, comprising a first terminal, a second terminal, and a control terminal, wherein the first terminal of the thirteenth transistor is coupled with the control terminal of the eighth transistor, the second terminal of the thirteenth transistor is configured to receive the first control signal of a previous-stage shift register, and the control terminal of the thirteenth transistor is configured to receive a first direction signal; and
a fourteenth transistor, comprising a first terminal, a second terminal, and a control terminal, wherein the first terminal of the fourteenth transistor is coupled with the control terminal of the eighth transistor, the second terminal of the fourteenth transistor is configured to receive the first control signal of a next-stage shift register, and the control terminal of the fourteenth transistor is configured to receive a second direction signal.

10. The electronic device of claim 4, wherein when the third control signal of the shift register has the first voltage level, the second control signal of a previous-stage shift register, the first control signal of the shift register, and the second control signal of the shift register are switched from the first voltage level to the second voltage level in sequence.

11. The electronic device of claim 10, wherein the third control signal of the shift register is maintained at the first voltage level for a predetermined time length, each one of the first clock signal group has a first pulse width when each one of the first clock signal group has the second voltage level, and the predetermined time length is twice as the first pulse width.

12. The electronic device of claim 4, wherein when the third control signal of the shift register has the first voltage level, the second control signal of a previous-stage shift register, the first control signal of the shift register, the second control signal of the shift register, and the first control signal of a next-stage shift register is switched from the first voltage level to the second voltage level in sequence.

13. The electronic device of claim 12, wherein the third control signal of the shift register is maintained at the first voltage level for a predetermined time length, each of the first clock signal group has a first pulse width when each of the first clock signal group has the second voltage level, and the predetermined time length is three times as the first pulse width.

14. A shift register, comprising:
a first output circuit, comprising a first node, wherein when an enabling voltage is provided to the first node, the first output circuit outputs a corresponding one of a first clock signal group as a second control signal, and outputs a corresponding one of a second clock signal group as a first control signal, wherein a duty ratio of the first clock signal group is different from a duty ratio of the second clock signal group;
a second output circuit, wherein when the enabling voltage is provided to the first node, the second output circuit outputs a first reference voltage as a third control signal, and when a disabling voltage is provided to the first node, the second output circuit outputs a second reference voltage as the third control signal;
an input circuit, configured to provide the enabling voltage to the first node; and
a voltage-stabilizing control circuit, configured to provide the disabling voltage to the first node according to other corresponding one of the first clock signal group.

15. The shift register of claim 14, wherein the first output circuit comprises:
a first transistor, comprising a first terminal, a second terminal, and a control terminal, wherein the first terminal of the first transistor is configured to receive the corresponding one of the second clock signal group, the second terminal of the first transistor is coupled with a first output node, and the control terminal of the first transistor is coupled with the first node;
a second transistor, comprising a first terminal, a second terminal, and a control terminal, wherein the first terminal of the second transistor is configured to receive the corresponding one of the first clock signal group, the second terminal of the second transistor is coupled with a second output node, and the control terminal of the second transistor is coupled with the first node;
a third transistor, comprising a first terminal, a second terminal, and a control terminal, wherein the first terminal of the third transistor is coupled with the first output node, the second terminal of the third transistor is configured to receive the first reference voltage, and the control terminal of the third transistor is coupled with a second node; and
a fourth transistor, comprising a first terminal, a second terminal, and a control terminal, wherein the first terminal of the fourth transistor is coupled with the second output node, the second terminal of the fourth transistor is configured to receive the first reference voltage, and the control terminal of the fourth transistor is coupled with the second node,
wherein the first output node and the second output node are configured to output the first control signal and the second control signal, respectively.

16. The shift register of claim 15, wherein the voltage-stabilizing control circuit comprises:
a fifth transistor, comprising a first terminal, a second terminal, and a control terminal, wherein the first terminal of the fifth transistor is configured to receive the other corresponding one of the first clock signal group or the second reference voltage, the control terminal of the fifth transistor is configured to receive the other corresponding one of the first clock signal group, and the second terminal of the fifth transistor is coupled with the second node;
a sixth transistor, comprising a first terminal, a second terminal, and a control terminal, wherein the first terminal of the sixth transistor is coupled with the second node, the second terminal of the sixth transistor is configured to receive the first reference voltage, and the control terminal of the sixth transistor is coupled with the first node; and
a seventh transistor, comprising a first terminal, a second terminal, and a control terminal, wherein the first terminal of the seventh transistor is coupled with the first node, the second terminal of the seventh transistor is configured to receive the first reference voltage, and the control terminal of the seventh transistor is coupled with the second node.

17. The shift register of claim 16, wherein the input circuit comprises:
an eighth transistor, comprising a first terminal, a second terminal, and a control terminal, wherein the first terminal of the eighth transistor is coupled with the first node, the control terminal of the eighth transistor is configured to receive the first control signal of a previous-stage shift register or the second control signal of the previous-stage shift register,
wherein the second terminal of the eighth transistor is coupled with the control terminal of the eighth transistor, or configured to receive the second reference voltage.

18. The shift register of claim 17, wherein the second output circuit comprises:
a ninth transistor, comprising a first terminal, a second terminal, and a control terminal, wherein the first terminal of the ninth transistor is configured to receive the second reference voltage, the second terminal of the ninth transistor is coupled with a third node, and the control terminal of the ninth transistor is coupled with the second node; and
a tenth transistor, comprising a first terminal, a second terminal, and a control terminal, wherein the first terminal of the tenth transistor is coupled with the second terminal of the ninth transistor, the second terminal of the tenth transistor is configured to receive the first reference voltage, and the control terminal of the tenth transistor is coupled with the first node.

19. The shift register of claim 18, wherein the second output circuit further comprises:
an eleventh transistor, comprising a first terminal, a second terminal, and a control terminal, wherein the first terminal of the eleventh transistor is configured to receive the second reference voltage, the control terminal of the eleventh transistor is coupled with the second terminal of the ninth transistor; and
a twelfth transistor, comprising a first terminal, a second terminal, and a control terminal, wherein the first terminal of the twelfth transistor is coupled with the second terminal of the eleventh transistor, the second terminal of the twelfth transistor is configured to receive the first reference voltage, and the control terminal of the twelfth transistor is coupled with the first node.

20. The shift register of claim 16, wherein the input circuit comprises:
an eighth transistor, comprising a first terminal, a second terminal, and a control terminal, wherein the first terminal of the eighth transistor is coupled with the first node, the second terminal of the eighth transistor is configured to receive the second reference voltage;
a thirteenth transistor, comprising a first terminal, a second terminal, and a control terminal, wherein the first terminal of the thirteenth transistor is coupled with the control terminal of the eighth transistor, the second terminal of the thirteenth transistor is configured to receive the first control signal of a previous-stage shift register, and the control terminal of the thirteenth transistor is configured to receive a first direction signal; and
a fourteenth transistor, comprising a first terminal, a second terminal, and a control terminal, wherein the first terminal of the fourteenth transistor is coupled with the control terminal of the eighth transistor, the second terminal of the fourteenth transistor is configured to receive the first control signal of a next-stage shift register, and the control terminal of the fourteenth transistor is configured to receive a second direction signal.

21. The shift register of claim 14, wherein when the third control signal of the shift register has a first voltage level, the second control signal of a previous-stage shift register, the first control signal of the shift register, and the second control signal of the shift register are switched from the first voltage level to a second voltage level in sequence.

22. The shift register of claim 21, wherein the third control signal of the shift register is maintained at the first voltage level for a predetermined time length, each of the first clock signal group has a first pulse width when each of the first clock signal group has the second voltage level, and the predetermined time length is twice as the first pulse width.

23. The shift register of claim 14, wherein when the third control signal of the shift register has a first voltage level, the second control signal of a previous-stage shift register, the first control signal of the shift register, the second control signal of the shift register, and the first control signal of a next-stage shift register is switched from the first voltage level to a second voltage level in sequence.

24. The shift register of claim 23, wherein the third control signal of the shift register is maintained at the first voltage level for a predetermined time length, each of the first clock signal group has a first pulse width when each of the first clock signal group has the second voltage level, and the predetermined time length is three times as the first pulse width.

* * * * *